US 6,671,163 B2

(12) United States Patent
Shkolnikow et al.

(10) Patent No.: US 6,671,163 B2
(45) Date of Patent: Dec. 30, 2003

(54) INTEGRATED SPARK AND SWITCH UNIT FOR COMBUSTION FASTENER DRIVING TOOL

(75) Inventors: Yury Shkolnikow, Glenview, IL (US); Murry Weinger, Green Oaks, IL (US); Shane Miears, Round Lake Beach, IL (US); Michael A. Reinhart, Lake Villa, IL (US)

(73) Assignee: Illinois Tool Works Inc., Glenview, IL (US)

( * ) Notice: Subject to any disclaimer, the term of this patent is extended or adjusted under 35 U.S.C. 154(b) by 91 days.

(21) Appl. No.: 10/066,852

(22) Filed: Feb. 4, 2002

(65) Prior Publication Data

US 2003/0146259 A1 Aug. 7, 2003

(51) Int. Cl.⁷ .................................................. F23Q 3/00
(52) U.S. Cl. ........................ 361/253; 361/18; 361/115; 361/160
(58) Field of Search ................................ 361/253, 115, 361/18, 160

(56) References Cited

U.S. PATENT DOCUMENTS 5,133,329 A  * 7/1992  Rodseth et al. ............. 123/630
5,415,136 A    5/1995  Doherty et al. ............. 123/465 C

* cited by examiner

Primary Examiner—Stephen W. Jackson
(74) Attorney, Agent, or Firm—Lisa M. Soltis; Mark W. Crain; Donald J. Poreh

(57) ABSTRACT

A combustion-powered tool having a workpiece contacting element movable relative to the tool as the tool is depressed prior to firing includes a spark unit having a high voltage spark supply for providing an ignition spark, a printed circuit board having a first portion configured for receiving and being electrically connected to the high voltage spark supply, and a second portion configured for receiving and being electrically connected to both an actuator switch and a trigger switch, the switches and the spark supply being electrically connected so that to enable firing, the workpiece contact element actuates the actuator switch, which then enables activation of the trigger switch. A unitary actuator has a fixed end, a movable end engageable by movement of the workpiece contact element and a middle portion for engaging the actuator switch upon movement of the movable end caused by depression of the tool against a workpiece.

17 Claims, 2 Drawing Sheets

INTEGRATED SPARK AND SWITCH UNIT FOR COMBUSTION FASTENER DRIVING TOOL

BACKGROUND OF THE INVENTION

The present invention relates generally to improvements in fastener driving tools, and specifically to such tools which are combustion powered and are used in rough framing and/or the installation of trim, other decorative applications and finishing applications utilizing fasteners which are relatively small, made of relatively thin wire stock, and/or which are used with relatively small and/or delicate workpieces. The latter will generally be referred to as "trim applications." Included in the present tool are several features intended to make the manufacture, use and/or repair of such tools more efficient.

Portable combustion powered tools for use in driving fasteners into workpieces are described in commonly assigned patents to Nikolich, U.S. Pat. Nos. Re. 32,452; 4,403,722; 4,483,473; 4,483,474; 4,552,162; 5,197,646 and 5,263,439, all of which are incorporated herein by reference. Such combustion powered tools particularly designed for trim applications are disclosed in commonly assigned U.S. Pat. No. 6,016,622, also incorporated by reference herein. Similar combustion powered nail and staple driving tools are available from ITW-Paslode under the IMPULSE® brand.

Such tools incorporate a generally pistol-shaped tool housing enclosing a small internal combustion engine. The engine is powered by a canister of pressurized fuel gas also called a fuel cell. A battery-powered high voltage spark unit, also known as an electronic power distribution unit or electronic sending unit produces the spark for ignition, and a fan located in the combustion chamber provides for both an efficient combustion within the chamber, and facilitates scavenging, including the exhaust of combustion by-products. The engine includes a reciprocating piston having an elongate, rigid driver blade disposed within a piston chamber of a cylinder body.

A wall of the combustion chamber is axially reciprocable about a valve sleeve and, through a linkage, moves to close the combustion chamber when a workpiece contact element (WCE) at the end of a nosepiece, or nosepiece assembly, connected to the linkage is pressed against a workpiece. This pressing action also triggers the introduction of a specified volume of fuel gas into the combustion chamber from the fuel cell.

Upon the pulling of a trigger, which causes the ignition of the gas in the combustion chamber, the piston and the driver blade are shot downward to impact a positioned fastener and drive it into the workpiece. As the piston is driven downward, a displacement volume enclosed in the piston chamber below the piston is forced to exit through one or more exit ports provided at a lower end of the cylinder. After impact, the piston then returns to its original or "ready" position through differential gas pressures within the cylinder. Fasteners are fed into the nosepiece from a supply assembly, such as a magazine, where they are held in a properly positioned orientation for receiving the impact of the driver blade.

To prevent firing of the tool prior to the WCE being pressed against a workpiece, it is known to provide a separate actuator switch which is triggered by movement of the WCE and which is also electrically connected to the trigger switch. The circuit is designed so that the trigger switch is inoperable until the actuator switch is activated by movement of the WCE. In prior tools, the mechanical linkage of such actuation systems involved multiple components that complicated manufacture and assembly of the tools.

Another design feature of such tools is that the actuator and trigger switches are remotely mounted in the tool housing, thus complicating assembly and manufacture. In addition, the construction of the switches was such that internal optical components were difficult to maintain in alignment. Further, the switches were prone to foreign matter falling on the optics and impairing operation.

Thus, a first object of the present invention is to provide an improved integrated spark unit for a combustion powered tool in which the actuator and trigger switches are mounted on a single circuit board with the spark unit.

Another object of the present invention is to provide an improved combustion powered tool in which the actuator switch and the trigger switch are provided in a single unit in close proximity to each other.

Still another object of the present invention is to provide an improved integrated spark unit for a combustion powered tool in which the actuator is unitary for facilitating manufacture, assembly and operation.

Yet another object of the present invention is to provide an improved combustion powered tool in which the actuator and trigger switches are provided in a single molded unit which also provides the mounting point for a unitary switch actuator, the latter configured for being engaged by movement of the workpiece contact element to enable actuation of the trigger switch.

BRIEF SUMMARY OF THE INVENTION

The above-listed objects are met or exceeded by the present combustion powered tool featuring an integrated spark unit having the actuator and trigger switches mounted together on a common circuit board with the spark supply and also with the switches being molded together for easier manufacturing and assembly. A preferably unitary actuator is mountable at one end to the switch unit and a second movable end is actuated by movement of the workpiece contact element to activate the actuator switch and thus enable the actuation of the trigger switch for tool firing. The actuator accommodates overtravel of the combustion chamber due to workpiece contact element movement.

More specifically, an integrated spark unit is provided for a combustion-powered tool having a workpiece contacting element which moves relative to the tool as the tool is depressed prior to firing. The unit includes a high voltage spark supply for providing an ignition spark, a unitary printed circuit board having a first portion configured for receiving and being electrically connected to the high voltage spark supply and a second portion configured for receiving and being electrically connected to both an actuator switch and a trigger switch. The trigger switch, the actuator switch and the spark supply being electrically connected so that to enable firing, the workpiece contact element actuates the actuator switch, which then enables the activation of the trigger switch. A preferably unitary actuator has a fixed end, a movable end engageable by movement of the workpiece contact element and a middle portion for engaging the actuator switch upon movement of the movable end caused by depression of the tool against a workpiece.

DETAILED DESCRIPTION OF THE INVENTION

Figure 1:
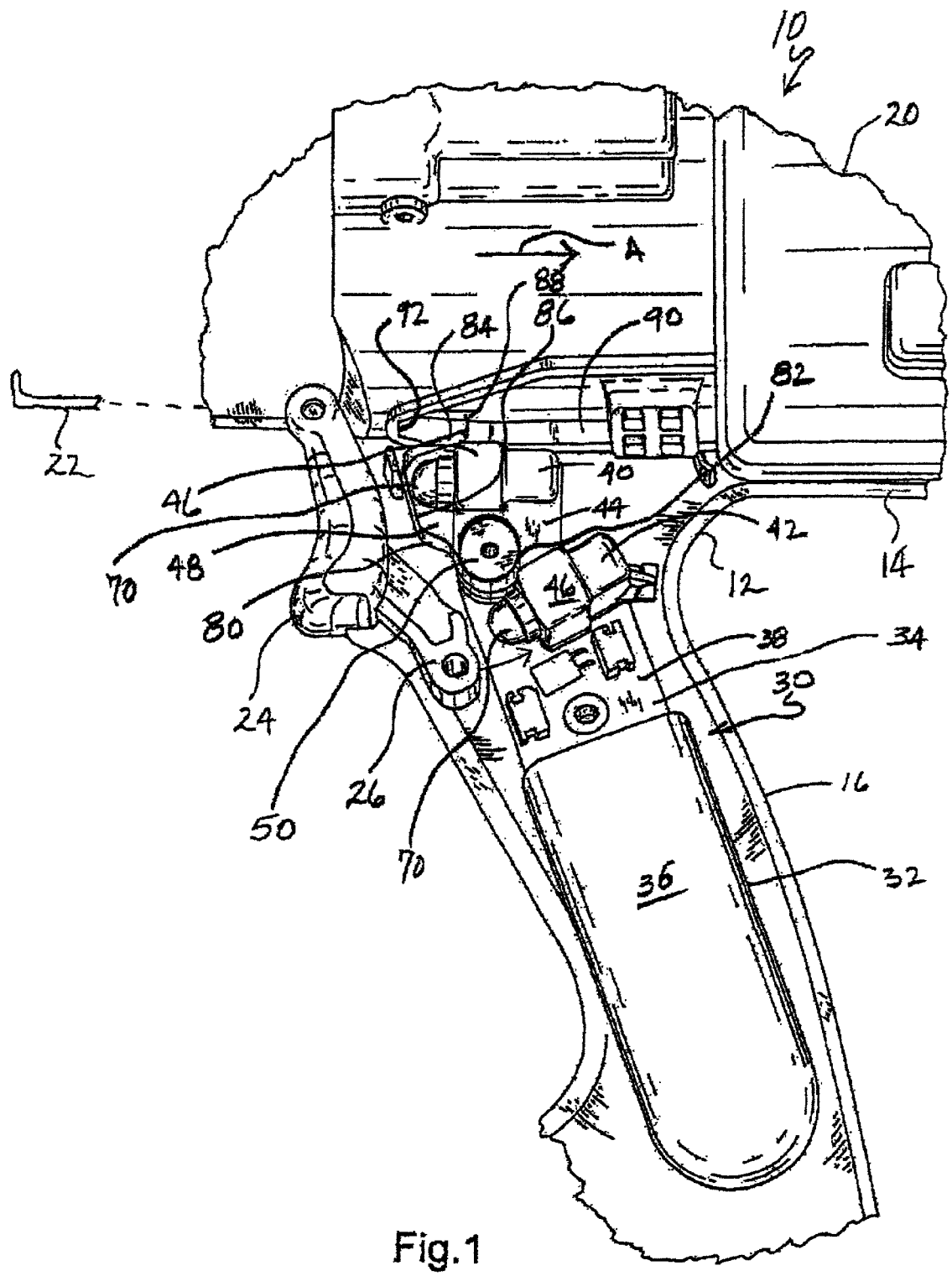
FIG. 1 is a fragmentary side elevational view of a combustion tool featuring the present integrated spark unit.

Referring now to FIG. 1, a combustion tool suitable for use with the present invention is generally designated 10 and includes a housing 12 including a spark driving portion 14, a handle portion 16 and a magazine portion (not shown). For the purposes of this invention, the portions are preferably integrally joined together, however it is contemplated that any of the portions described herein may be separately fabricated and subsequently attached using conventional fastening technology, such as chemical adhesives, ultrasonic welding, threaded fasteners, rivets, etc. In the present invention, the housing 12 is made of two separate components each having the spark driving portion 14, the handle portion 16 and the magazine portion formed as a single piece.

As is known in the art, the fastener driving portion 14 encloses a combustion chamber 20 which is connected to a workpiece contact element 22 and reciprocates relative to the housing 12 upon the depression of the tool 10 against a workpiece (not shown). While the tool 10 is contemplated as operating in a variety of orientations, it is preferred that the reciprocation of the workpiece contact element 22 and the combustion chamber 20 be vertically upward relative to the housing 12. A trigger 24 is pivotable relative to the handle portion 14 and is provided with a switch formation 26.

An integrated spark unit, generally designated 30, is provided with the components used to sense tool conditions, provide the desired sequential operation, operate a fan motor (not shown) and provide a spark for combustion. An advantage of the present unit 30 is that all of these functions are provided in a single unit with components all physically and electrically connected to a single circuit board 32. The circuit board 32 includes two portions which, in the preferred embodiment are unitarily joined, however separated portions are contemplated to provide other advantages of the invention listed below. A first portion 34 of the circuit board 32 is configured to receive a high voltage spark supply 36 for providing an ignition spark. The spark supply 36 is both physically received by and is electrically connected to the circuit board 32, as is well known in the art.

One of the features of the present invention is that the circuit board 32 also includes a second portion 38 that is configured for receiving and being electrically connected to both an actuator switch 40 and a trigger switch 42. As is known in the combustion tool art, and taught by the patents incorporated by reference, the trigger switch 42, the actuator switch 40 and the spark supply 36 are electrically connected so that to enable firing, the workpiece contact element 22, through the combustion chamber 20 actuates the actuator switch 40, which then enables the trigger switch 42 to be activated by a user to fire the tool 10. By providing the components on a single circuit board 32, wiring previously used to connect the various components, and particularly the switches 40, 42 to the spark supply 36 have been eliminated. Also, with the present configuration of the circuit board 32, the manufacturing costs and assembly time can be reduced for the tool 10.

Figure 2:
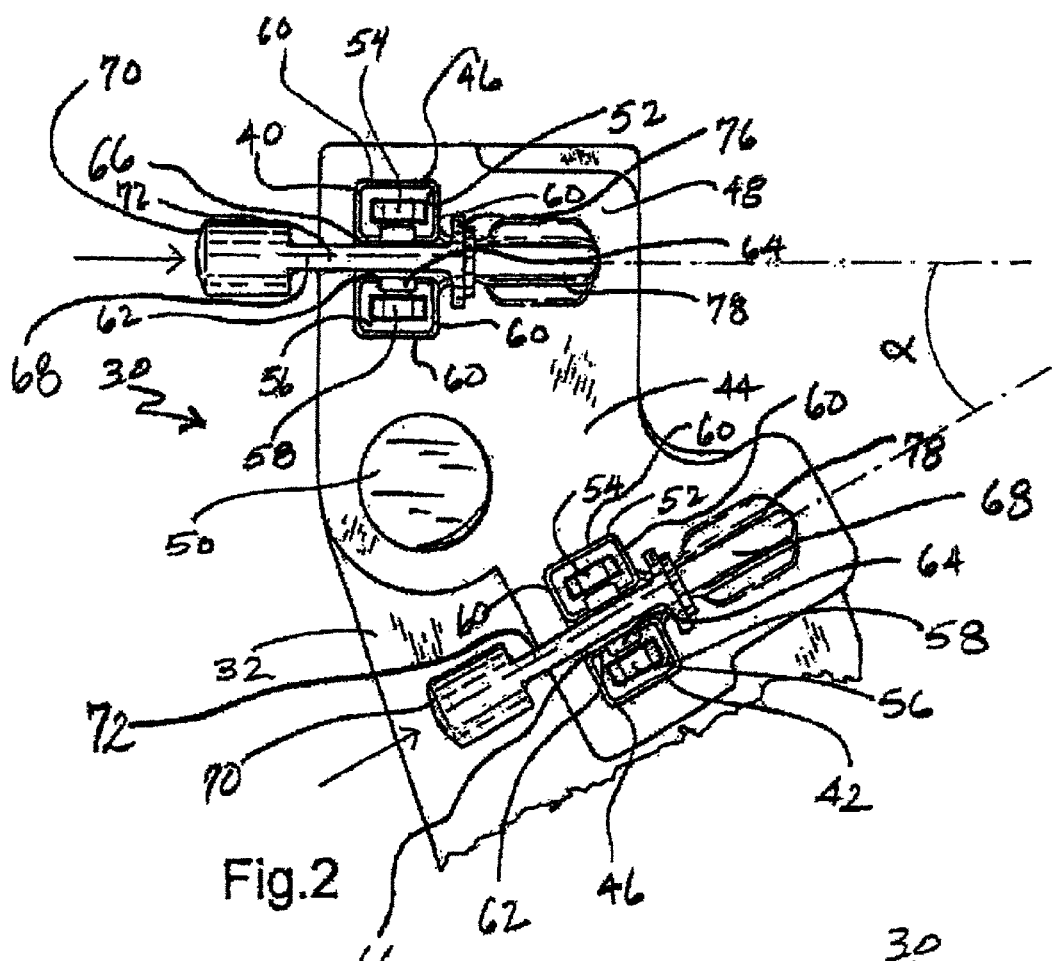
FIG. 2 is a fragmentary overhead plan view of a portion of the circuit board of the present integrated spark unit showing the construction of the switch module.
Figure 3:
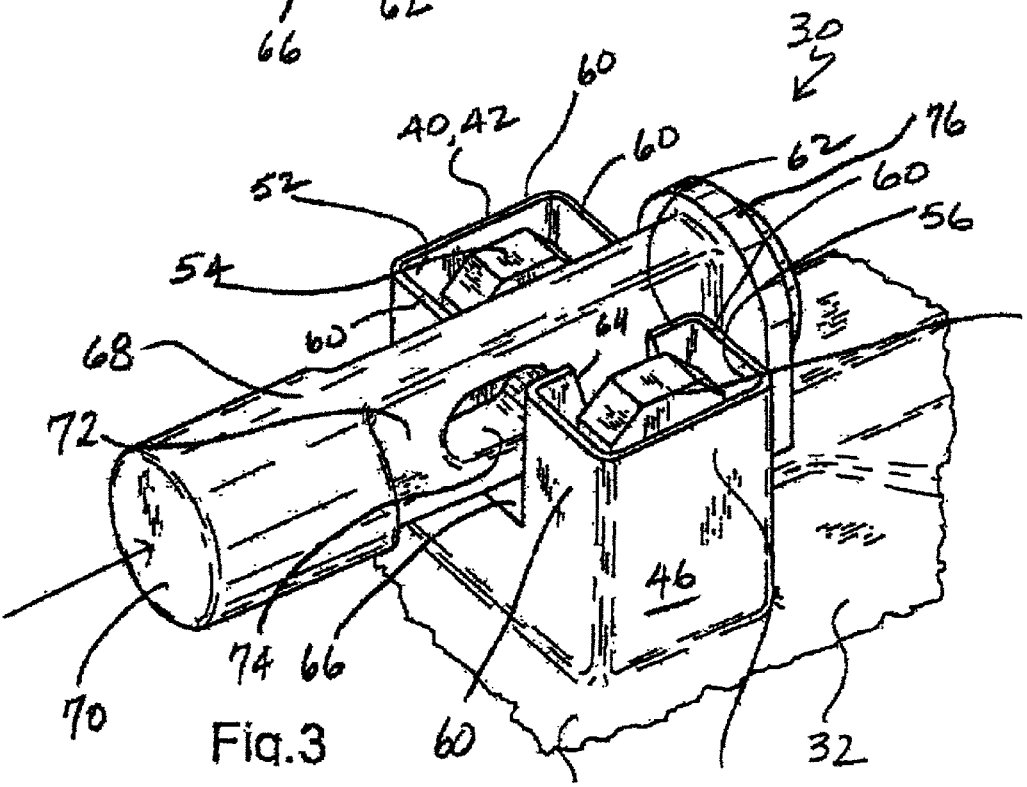
FIG. 3 is a fragmentary perspective view of one of the switch housings.

Referring now to FIGS. 1–3, another feature of the present invention is that the actuator switch 40 and the trigger switch 42 are preferably molded into a single switch module 44 mounted on the second circuit board portion 38. Preferably the switches 40, 42 have the same construction described below, however separate and alternative switch construction is contemplated which provides for activation by axial depression of a contact member.

In the preferred embodiment, each switch 40, 42 includes a switch housing 46 secured to a base 48, preferably by being integrally molded thereto, however other conventional fastening technologies are contemplated. The housings 46 are configured to define a space between the actuator switch 40 and the trigger switch 42 sufficient to accommodate an actuator mounting point 50, which in the preferred embodiment is a cylindrical boss. However, other mounting points are contemplated, including, but not limited to fastener apertures, pins, and lugs. To facilitate access to and operation of the actuator described below, the base 48 is dimensioned to allow positioning of the switches 40, 42 at an approximate 30° angle to each other. Angle α is depicted in FIG. 2. The base 48 is secured to the circuit board 32 by pins, soldering, adhesive or other known procedures well known in the art to provide secure attachment and positive electrical connection.

At least one and preferably each switch housing 46 defines an emitter chamber 52 configured for accommodating an emitter 54 and a sensor chamber 56 configured for accommodating a sensor 58. Each chamber 52, 56 has three closed walls 60 and one wall 62 defining an aperture 64 and defining an interrupter channel 66 (best seen in FIG. 3). The chambers 52, 56 are preferably configured with a box-like shape to securely retain the emitter 54 and the sensor 58. In addition the chambers 52, 56 are configured so that the apertures 64 are in registry with each other for facilitating optical connection therebetween and are disposed in sufficiently close proximity to each other so that the apertured walls 62 are separated only by the interrupter channel 66. This close proximity of the chambers 52, 56 enhances the optical connections between the emitter 54 and the sensor 58 and thus improves reliability of the switches 40, 42.

Upon assembly, the emitter 54 and the sensor 58 are disposed in the chambers 52, 56 to establish optical connection through the apertures 64. An interrupter member 68 is slidably located in the interrupter channel 66. One end 70 of the interrupter member 68 forms a contact, and a central portion 72 is solid and optically opaque with the exception of an opening 74 (FIG. 3). The opening 74 is positioned such that upon depression of the contact 70, the opening is placed in alignment with the apertures 64 to enable optical connection of the emitter 54 and the sensor 58, and thus complete the circuit for that switch 40, 42. Opposite the contact 70, the interrupter member 68 has flared formation 76 which engages a biasing switch guide 78. The switch guide 78 has a spring (not shown) or other mechanism for urging the interrupter member 68 so that the opening 74 is normally out of alignment with the apertures 64 and the switches 40, 42 are inactivated.

Referring again to FIG. 1, another feature of the present invention is a preferably one piece or unitary actuator 80 which is configured for activating the actuator switch 40 upon sufficient depression of the WCE 22 and movement of the combustion chamber 20 to enable firing of the tool 10. In the preferred embodiment, the actuator 80 is a single piece of spring steel or equivalent metal or plastic and has a fixed end 82 configured for attachment to the mounting point 50, a movable end 84 engageable by movement of the workpiece contact element 22 through the combustion chamber 20, and a middle portion 86 forming an actuator switch contact surface configured for engaging the actuator switch 40 upon movement of the movable end 84 caused by depression of the tool 10 against a workpiece.

More specifically, the actuator 80 is generally bow-shaped, with the fixed end 82 defining an aperture configured for frictionally engaging the mounting boss 50 and the movable end 84 having an engagement tab 88 generally vertically aligned with the fixed end, and the middle portion 86 being laterally bowed relative to the fixed and movable ends 82, 84 for engaging and sufficiently depressing the contact 70 of the actuator switch 40 to align the opening 74 with the apertures 64.

Opposite the fixed end 82, the movable end 84 is dimensioned so that the engagement tab 88 rides in a window 90 in the wall of the combustion chamber 20. As the chamber 20 moves upward relative to the tool housing 12 (from left to right as seen in FIG. 1 and depicted by arrow A), an endwall or stop surface 92 of the window 90 will engage the engagement tab 88 and move the movable end 84 of the actuator 80 upward so that the middle portion 86 pushes the contact 70 against the biasing force to align the apertures 64 and the opening 74 to close the actuator switch 40.

Once the actuator switch 40 is closed, sufficient depression of the trigger 24 by the user so that the switch formation 26 depresses the contact 70 of the trigger switch 42 causes firing of the tool 10. More specifically, firing is achieved by a spark generated by the power unit 36 which is transmitted to an interior of the combustion chamber 20 for igniting a fuel/air mixture as is known in the art. Due to the spring-like construction of the actuator 80, additional upward movement of the combustion chamber 20 past the point of actuation of the actuator switch 40, also known as overtravel, will not damage the switch module 44.

Thus, it will be seen that the present integrated spark unit 30, featuring the switch module 44, provides several advantages over prior art systems. First, the switch module 44 and the spark unit 36 are mounted on a single circuit board 32 for simplification and efficiency. Next, the switch module 44 provides both the actuator and trigger switches 40, 42, as well as the actuator mounting point 50 in a single unit, further simplifying the construction and assembly of the unit 30. In addition, the unitary actuator 80 preserves the sequential operation of the tool 10 such that the actuator switch 40 is activated prior to the trigger switch 42, and accommodates overtravel of the combustion chamber 20.

While specific embodiments of the present integrated switch module and spark unit for a combustion fastener driving tool have been shown and described, it will be appreciated by those skilled in the art that changes and modifications may be made thereto without departing from the invention in its broader aspects and as set forth in the following claims.

What is claimed is:

1. An integrated spark unit for a combustion-powered tool having a workpiece contacting element which moves relative to the tool as the tool is depressed prior to firing, said unit comprising:
   a high voltage spark supply for providing an ignition spark;
   a unitary printed circuit board having a first portion configured for receiving and being electrically connected to said high voltage spark supply;
   a second portion of said circuit board being configured for being a mounting point for and being electrically connected to both an actuator switch and a trigger switch;
   said trigger switch, said actuator switch and said spark supply being electrically connected so that to enable firing, the workpiece contact element actuates said actuator switch, which then enables activation of said trigger switch.

2. The unit of claim 1 wherein said actuator switch and said trigger switch are molded into a single switch module mounted on said second circuit board portion.

3. The unit of claim 2 wherein said switch module is configured to define a space between said actuator switch and said trigger switch sufficient to accommodate an actuator mounting point.

4. The unit of claim 3 wherein said switches are mounted on said module at an approximate 30° angle to each other.

5. The unit of claim 3 wherein said actuator mounting point is a mounting boss.

6. The unit of claim 3 further including an actuator having a fixed end configured for attachment to said mounting point, a movable end engageable by movement of the workpiece contact element and a middle portion forming an actuator switch contact surface configured for engaging said actuator switch upon movement of said movable end caused by depression of the tool against a workpiece.

7. The unit of claim 6 wherein said actuator is generally bow-shaped, with said fixed end defining an aperture configured for engaging a mounting boss, said movable end having an engagement tab generally vertically aligned with said fixed end, and said middle portion being laterally bowed relative to said fixed and movable ends for accommodating said actuator switch.

8. The unit of claim 6 wherein the tool is configured so that depression of the tool against a workpiece causes the workpiece contact element to move relatively upwardly relative to the tool, and the tool further includes a combustion chamber which reciprocates with the workpiece contact element, said movable end of said actuator being engaged with the combustion chamber such that upward movement of the combustion chamber causes actuation of said actuator switch.

9. The unit of claim 8 wherein the combustion chamber has a window with a stop surface, and said movable end is actuated through contact with the stop surface.

10. The unit of claim 8 wherein said actuator is configured for allowing an overtravel position of the combustion chamber with prevents damage to said actuator switch.

11. The unit of claim 2 wherein at least one of said switches includes a housing defining an emitter chamber configured for accommodating an emitter and a sensor chamber configured for accommodating a sensor, said chambers being separated by an interrupter channel configured for slidably receiving an interrupter member, each said housing being integrally formed with said switch module.

12. The unit of claim 11 in which at least one of said switch housings is configured so that said emitter chamber and said sensor chamber are in close proximity to each other and are separated only by said interrupter channel for facilitating optical alignment of said emitter and said sensor.

13. A combustion-powered tool having a workpiece contacting element which moves upward relative to the tool as the tool is depressed prior to firing and the driving of a fastener, said tool comprising:
   a high voltage spark supply for providing an ignition spark;
   an actuator switch and a trigger switch being electrically connected to each other and to said power supply so that to enable firing, the workpiece contact element actuates said actuator switch, which then enables said trigger switch to be activated by a user;

an actuator having a fixed end configured for attachment to said tool, a movable end engageable by movement of the workpiece contact element and a middle portion forming an actuator switch contact surface configured for engaging said actuator switch upon movement of said movable end caused by depression of the tool against a workpiece.

14. A combustion-powered tool having a workpiece contacting element which moves upward relative to the tool as the tool is depressed prior to firing and the driving of a fastener, said tool comprising:

a high voltage spark supply for providing an ignition spark;

an actuator switch and a trigger switch being electrically connected to each other and to said power supply so that to enable firing, the workpiece contact element actuates said actuator switch, which then enables said trigger switch to be activated by a user;

an actuator having a fixed end configured for attachment to said tool, a movable end engageable by movement of the workpiece contact element and a middle portion forming an actuator switch contact surface configured for engaging said actuator switch upon movement of said movable end caused by depression of the tool against a workpiece; and wherein said actuator is unitary and generally bow-shaped, with said fixed end defining an aperture configured for engaging a mounting boss, said movable end having an engagement tab generally vertically aligned with said fixed end, and said middle portion being laterally bowed relative to said fixed and movable ends for accommodating said actuator switch.

15. The tool of claim 14 wherein the tool is configured so that depression of the tool against a workpiece causes the workpiece contact element to move relatively upwardly relative to the tool, and the tool further includes a combustion chamber which reciprocates with the workpiece contact element, said movable end of said actuator being configured to be engaged with the combustion chamber such that upward movement of the combustion chamber causes actuation of said actuator switch.

16. The tool of claim 14 wherein said actuator switch and said trigger switch are integrally formed on a single unit forming said mounting boss, and said fixed end of said actuator is disposed on said mounting boss between said actuator switch and said trigger switch.

17. An integrated spark unit for a combustion-powered tool having a workpiece contacting element which moves relative to the tool as the tool is depressed prior to firing, said unit comprising:

a high voltage spark supply for providing an ignition spark;

a unitary printed circuit board having a first portion configured for receiving and being electrically connected to said high voltage spark supply;

a second portion of said circuit board being configured for receiving and being electrically connected to both an actuator switch and a trigger switch;

said trigger switch, said actuator switch and said spark supply being electrically connected so that to enable firing, the workpiece contact element actuates said actuator switch, which then enables activation of said trigger switch; and wherein said actuator switch and said trigger switch are molded into a single switch module mounted on said second circuit board portion, and wherein at least one of said switches includes a housing defining an emitter chamber configured for accommodating an emitter and a sensor chamber configured for accommodating a sensor, said chambers being separated by an interrupter channel configured for slidably receiving an interrupter member, each said housing being integrally formed with said switch module.

* * * * *

UNITED STATES PATENT AND TRADEMARK OFFICE
CERTIFICATE OF CORRECTION

PATENT NO.     : 6,671,163 B2
DATED          : December 30, 2003
INVENTOR(S)    : Shkolnikov et al.

It is certified that error appears in the above-identified patent and that said Letters Patent is hereby corrected as shown below:

<u>Title page,</u>
Item [12], please delete "Shkolnikow et al." and insert -- Shkolnikov et al. --
Item [75], Inventors, please delete "Yury Shkolnikow" and insert -- Yury Shkolnikov --; and please delete "Murry Weinger" and insert -- Murray Weinger --

Signed and Sealed this

Twenty-fifth Day of May, 2004

JON W. DUDAS
*Acting Director of the United States Patent and Trademark Office*